(12) United States Patent
Mbouombouo et al.

(10) Patent No.: US 6,587,991 B1
(45) Date of Patent: Jul. 1, 2003

(54) OPTIMIZED METAL STACK STRATEGY

(75) Inventors: Benjamin Mbouombouo, San Jose, CA (US); Sudhakar Sabada, Sunnyvale, CA (US)

(73) Assignee: LSI Logic Corporation, Milpitas, CA (US)

(*) Notice: Subject to any disclaimer, the term of this patent is extended or adjusted under 35 U.S.C. 154(b) by 22 days.

(21) Appl. No.: 09/941,359

(22) Filed: Aug. 28, 2001

(51) Int. Cl.[7] .............................................. G06F 17/50
(52) U.S. Cl. .............................................. 716/2; 716/5
(58) Field of Search ........................................ 716/2, 5

(56) References Cited

U.S. PATENT DOCUMENTS

| | | | | |
|---|---|---|---|---|
| 6,018,623 A | * | 1/2000 | Chang et al. | 716/6 |
| 6,265,746 B1 | * | 7/2001 | Madurawe et al. | 257/368 |
| 6,327,394 B1 | * | 12/2001 | Kash et al. | 382/280 |
| 6,381,730 B1 | * | 4/2002 | Chang et al. | 716/5 |
| 6,516,456 B1 | * | 2/2003 | Garnett et al. | 716/8 |

* cited by examiner

Primary Examiner—Matthew Smith
Assistant Examiner—Andrea Liu
(74) Attorney, Agent, or Firm—Sawyer Law Group

(57) ABSTRACT

An improved metal stack strategy is disclosed. A first aspect of the present invention provides a method for defining an optimized metal stack option based on critical path information. The method and system use interconnect data from timing critical paths from at least one previous design to generate interconnect statistical data. The interconnect statistical data is then used to vary physical properties of interconnects in a current design during simulation until optimum performance is achieved. A second aspect of the present invention provides a method for reusing an ASIC core design with different metal stack options. This method defines x common metal layers across at least two metal stack options, where interconnects on each of the metal layers have common physical and electrical characteristics. An ASIC core design based on the x common metal layers is also defined, thereby making the ASIC core compatible with the different metal stack options. Given custom ASIC designs, each having a total of y metal layers where y>x, respective custom ASICS may then be fabricated using the ASIC core design and different metal stack options.

12 Claims, 3 Drawing Sheets

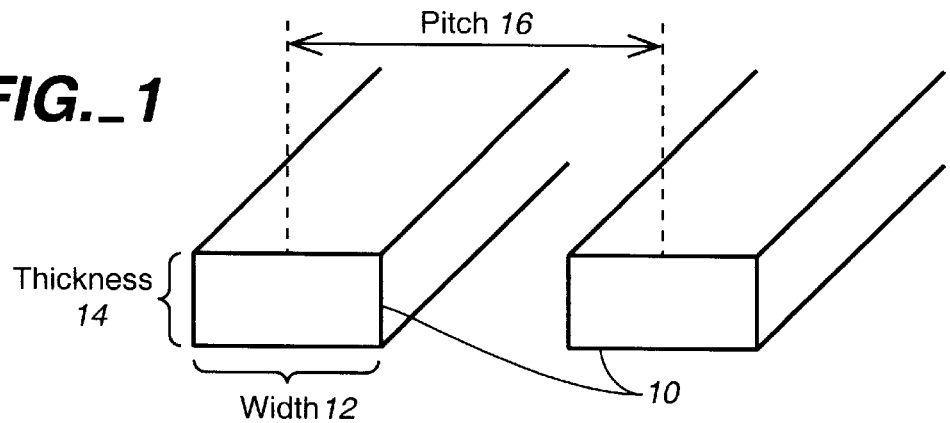

FIG._1

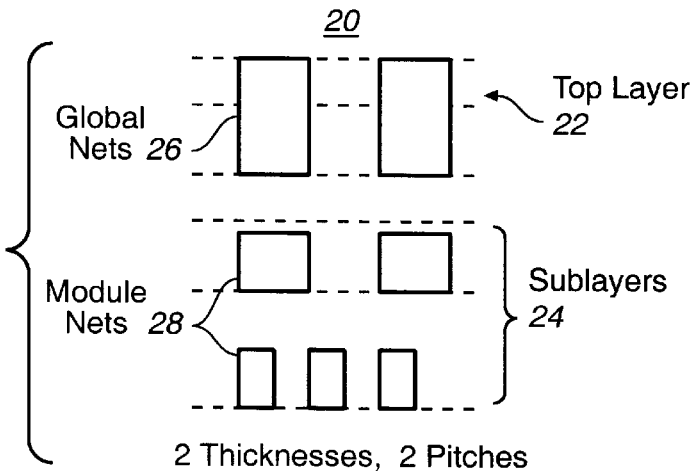

**FIG._2
(PRIOR ART)**

| Use interconnect data from timing critical paths in previous designs to generate interconnect statistical data | 100 |

↓

| Vary the physical properties of the interconnects in the current design during simulation using the interconnect statistical data until optimum performance is achieved | 102 |

↓

| Use the simulation results to show what the optimum dimensions for the interconnects have to be in order to achieve optimum performance | 104 |

FIG._3

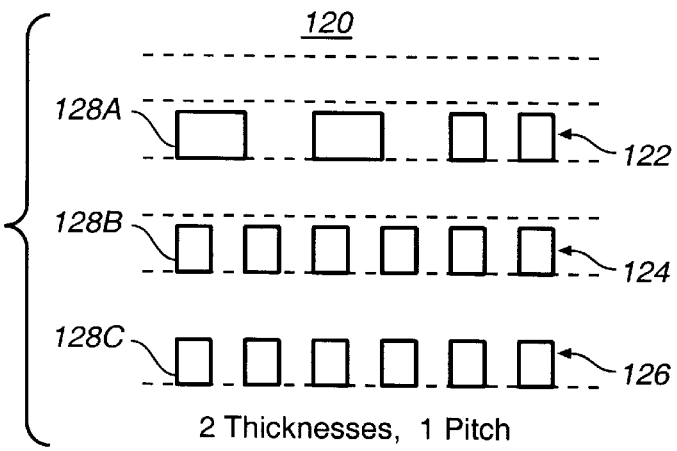

FIG._4

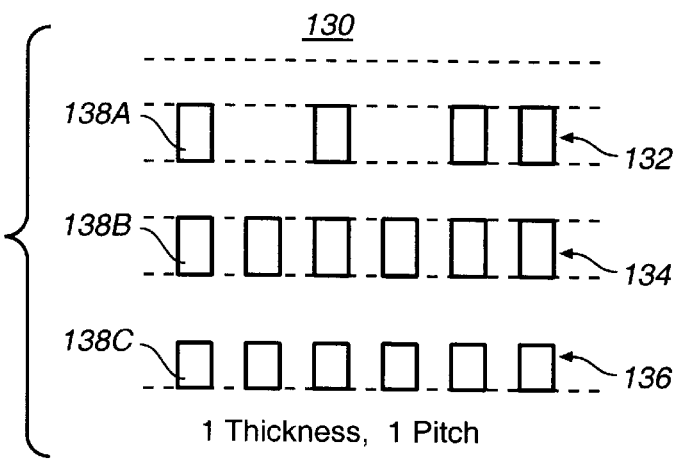

FIG._5

```
┌─────────────────────────────────────┐
│ Defining x common metal layers      │ ─ 200
│ across multiple metal stack options │
└─────────────────┬───────────────────┘
                  ▼
┌─────────────────────────────────────┐
│ Define ASIC core design based       │ ─ 204
│ on the x common metal layers        │
└─────────────────┬───────────────────┘
                  ▼
┌─────────────────────────────────────┐
│ Given custom ASIC designs, each     │
│ having a total of y metal layers    │ ─ 206
│ where y > x, fabricate respective   │
│ custom ASICS using the ASIC         │
│ core design and different metal     │
│ stack options                       │
└─────────────────────────────────────┘
```

FIG._6

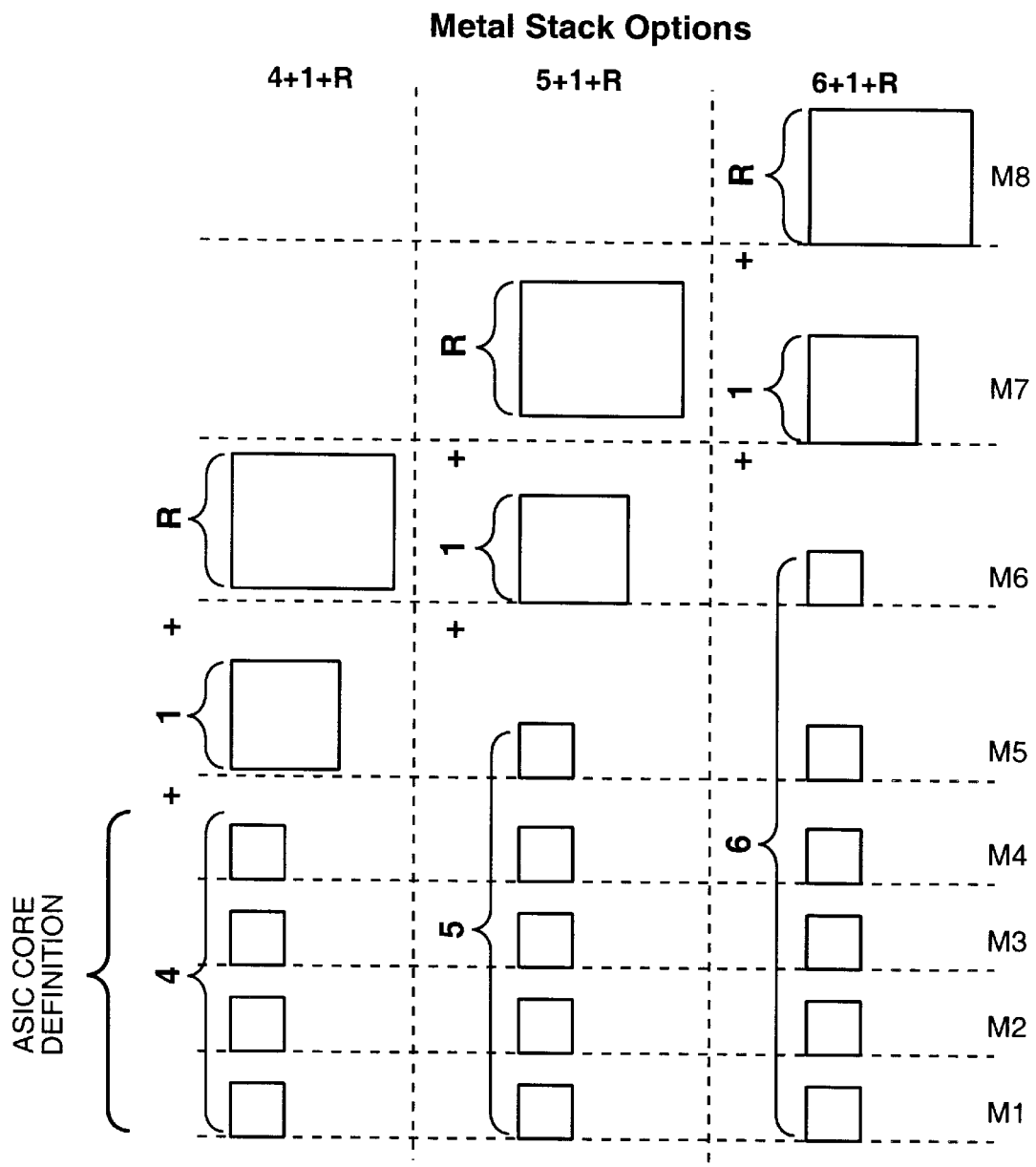
FIG._7

OPTIMIZED METAL STACK STRATEGY

FIELD OF THE INVENTION

The present invention relates to ASIC design and implementation, and more particularly to a metal stack strategy for ASICS.

BACKGROUND OF THE INVENTION

Metal interconnects connect gates and other devices in electronic circuitry, and are having an increasing large role in ASICS (Application Specific Integrated Circuit) in terms of performance and manufacturing. In deep sub-micron ASIC design, for instance, interconnects are overtaking the transistor as being the dominant factor affecting performance. That is, full performance of an ASIC design cannot be realized if the metal interconnects comprising the circuits are not optimized.

FIG. 1 is a block diagram illustrating the physical properties of interconnects 10 that can affect performance. When patterned on a substrate, each interconnect 10 is patterned with a certain width 12 and thickness (depth) 14. The spacing between adjacent interconnects 10 is called pitch 16, which is measured between the centerlines of interconnects 10.

With older process technology, the various layers of metal comprising the interconnects 10 could only be patterned relatively thick, which meant that they had to also be patterned very wide. This was disadvantageous because if the interconnects 10 could have been patterned thinner, a smaller width 12 could have been used, thereby saving space. Therefore, older process technology afforded designers little freedom in that the designers had no choice but to pattern the interconnects 10 fairly wide. As far as performance is concerned, wider interconnects 10 may reduce resistance, but the trade-off is that wide interconnects 10 waste space and do not result in very compact circuits.

Current process technology is capable of producing much thinner interconnects 10 than older process technology, and today designers attempt to pattern the interconnects 10 with the smallest possible geometry (width and thickness). One problem with patterning the interconnects 10 using the smallest possible geometry is that if the metal is patterned too thin widthwise, the interconnects 10 may have high resistance, which could throw off circuit timing and reduce performance. The benefit, however, of thin interconnects 10 is that higher compactness is achieved, posing designers with a potential trade-off between performance and compaction.

If the interconnects 10 are automatically patterned with the smallest possible geometry, the only variable left to designers to optimize performance of the interconnects 10 is to widen the pitch 16. Defining a metal stack strategy based on manufacturable wire sizes rather than on design requirements produces unacceptable results because minimum manufacturable wire sizes fail to deliver results in terms of performance and compaction.

Interconnects are also playing an important role in ASIC manufacturing. Custom ASICs are typically fabricated from ASIC cores. Once a custom ASIC is designed, a finished ASIC core is taken off the shelf and customized by placing metal stacks on top of the ASIC core to complete the custom design. Basically, a metal stack option in an ASIC core includes up to four metal interconnect layers (in the 0.18 $\mu$m and 0.13 $\mu$m node technologies). Four or more additional interconnect layers may then be added to the ASIC core to fabricate the custom ASIC with a total of eight or more metal interconnect layers.

A manufacturer may have many different metal stack options available. However, not all metal stack options will accept every ASIC core. In most current process technology, this requires most manufacturers to design each ASIC core multiple times, one for every metal stack option available. That is, every time a manufacturer uses a new process technology to create a new metal stack, a new core must be designed and created that is compatible with the new metal stack. Process technology changes every 15–18 months, but it may take up to six months to create a new core. Obviously, designing a new core for every metal tack option is expensive and time-consuming.

What is needed is an improved metal stack strategy. The metal stack strategy should optimize metal stack performance and eliminate the need to design an ASIC core for every metal stack option offered. The present invention addresses such needs.

BRIEF DESCRIPTION OF THE DRAWINGS

FIG. 1 is a block diagram illustrating the physical properties of interconnects 10 that can affect performance.

FIG. 2 is a diagram illustrating a cross-section of a conventional metal stack option for an ASIC.

FIG. 3 is a flow chart illustrating the process for defining optimized metal stack options in accordance with a preferred embodiment of the present invention.

FIG. 4 is a cross-section diagram of an optimized metal stack in accordance with a preferred embodiment of the present invention.

FIG. 5 is a cross-section diagram of a second metal stack option in accordance with an alternative embodiment of the present invention that results in one thickness and one pitch.

FIG. 6 is a flow chart illustrating a process for reusing a single ASIC core design with different metal stack options in accordance with a preferred embodiment of the present invention.

FIG. 7 depicts an ASIC core designed based on a common denominator for offered metal stack options.

SUMMARY OF THE INVENTION

The present invention provides an improved metal stack strategy. A first aspect of the present invention provides a method for defining an optimized metal stack option based on critical path information. The method and system use interconnect data from timing critical paths from at least one previous design to generate interconnect statistical data. The interconnect statistical data is then used to vary physical properties of interconnects in a current design during simulation until optimum performance is achieved.

A second aspect of the present invention provides a method for reusing an ASIC core design with different metal stack options. This method defines x common metal layers across at least two metal stack options, where interconnects on each of the metal layers have common physical and electrical characteristics. An ASIC core design based on the x common metal layers is also defined, thereby making the ASIC core compatible with the different metal stack options. Given custom ASIC designs, each having a total of y metal layers where y>x, respective custom ASICS may then be fabricated using the ASIC core design and different metal stack options.

According to the method and system disclosed herein, the first aspect of the present invention provides a metal stack strategy that optimizes metal stack performance based on critical paths, and the second aspect eliminates the need to design an ASIC core for each metal stack option offered.

DETAILED DESCRIPTION

The present invention relates to ASIC design and fabrication. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown but is to be accorded the widest scope consistent with the principles and features described herein.

A first aspect of the present invention provides a metal stack strategy that defines the metal stack based on critical paths in the ASIC design, thereby optimizing performance. In a second aspect of the present, metal stack strategy provides for ASIC core reuse, which eliminates the need to design an ASIC core for each metal stack option offered.

FIG. 2 is a diagram illustrating a cross-section of a conventional metal stack option for an ASIC. The metal stack option 20 includes a top layer 22 for the routing of global nets 26 and one more sublayers 24 for routing module nets 28. The current approach is to pattern the interconnects 10 on the sublayers 24 using the smallest possible manufacturable wire sizes in terms of width and thickness. Because the top level global nets 26 are typically longer than the module nets 28, the global nets 26 have approximately twice the thickness of the interconnects 10 on the sublayers 24, and must therefore be wider. A base pitch is defined for the bottom sublayer 24, which is typically the minimum pitch possible. The interconnects 10 on the middle sublayer 24 and the top layer 22 are routed by just doubling the pitch. Thus, this conventional approach results in a metal stack option 20 in which the interconnects 10 must be patterned using two thicknesses and two pitches.

Although the conventional metal stacks 20 generally experience high performance for the long global nets 26, the module nets 28 are not optimized for performance nor does the metal stack 20 maximize compaction.

The first aspect of the present invention provides an improved methodology for defining a metal stack that is driven directly by the design requirements of critical paths in the ASIC design, thereby optimizing performance.

FIG. 3 is a flow chart illustrating the process for defining optimized metal stack options in accordance with a preferred embodiment of the present invention. The process begins by using interconnect data from timing critical paths in previous designs to generate interconnect statistical data in step 100. In a preferred embodiment, the critical path information is gathered and analyzed as described in U.S. patent application Ser. No. 09/894,618 entitled "Timing Driven Interconnect Analysis" filed on Jun. 27, 2001, which is herein incorporated by reference.

In step 102, the physical properties of the interconnects in the current design are varied during simulation using the interconnect statistical data, and other data such as the number of logic levels and average wire length, until optimum performance is achieved. The physical properties of the interconnects that may be varied during the simulation process include the thickness, width, and pitch. Circuit timing is a function of both low resistance and high capacitance, and interconnect performance in the metal stack option is analyzed based on combinations of interconnect thickness, width and pitch to determine which combinations yield the greatest overall performance in terms of resistance, capacitance, and density. In a preferred embodiment, the optimum point results in the lowest resistance and the smallest timing delay.

In step 104, the simulation results are used to show what the optimum dimensions for the interconnects have to be in order to achieve optimum performance. For the global nets, which are long, resistance is the dominant factor and has to be minimized, but the capacitance also has to be kept low enough so that timing and crosstalk are not an issue. On average, the largest percentage of interconnect paths occur within nets on the sublayers. The major characteristics of the sublayers are to provide very little capacitance and to keep resistance low enough so that timing degradation at the sublayers does not become an issue.

In a preferred embodiment, the process yields an optimized metal stack option that is patterned with a combination of two thicknesses and one pitch.

FIG. 4 is a cross-section diagram of an optimized metal stack in accordance with a preferred embodiment of the present invention. The optimized metal stack option 20 includes a top layer 122 and two sublayers; a middle layer 124 and a bottom layer 126, where each layer includes a pattern of interconnects 128a, 128b, 128c, respectively. The interconnects 128c on the bottom layer 126 are patterned with a minimum thickness, while the interconnects 128a and 128b on the middle and top layers are patterned with a thickness double that of the bottom layer. In addition, the interconnects 128b and 128c on the sublayers 124 and 126 are patterned with a base pitch, while the interconnects 128a on the top layer 122 may be routed using either a single or double pitch (whichever gives the best performance).

The optimized metal stack option 120 results in the highest compaction for the module nets, and has optimized performance for both module nets and top level global nets. Because only a small percentage of the top level is used to route global nets, the remaining area can be used to route module nets. And since module nets are short, they may be patterned thin and with minimum pitch (compact). The optimum combinations is to use the optimum thickness for the sublayers and at the minimum pitch to optimize performance and density, and the thicker layers for global nets but with the same pitch as the sublayers.

FIG. 5 is a cross-section diagram of a second metal stack option in accordance with an alternative embodiment of the present invention that results in one thickness and one pitch. In the alternative metal stack option 130, all routing layers are patterned at the same thickness, while the middle sublayer 134 is patterned using the base pitch, and the global nets. 138a are routed by doubling the pitch. In a preferred embodiment, the top layer may be routed using either a single or double pitch.

Although the second metal stack option 130 provides optimized performance at the module level and highest compaction for the module level, this option is not optimized for performance at the intermediate sublayers. This option is also not optimized for the top layer 132 because the thickness for those interconnects is not at the optimum point for long global nets, resulting in non-optimum delays.

The metal stack options of the present invention afford designers With much more flexibility compared to traditional metal stack options, where the top layer is always a double pitch of the sub-layers. For traditional metal stack options, there is not option to use a single or double pitch on the top layer, as provided with the optimized metal stack options shown in FIGS. 4 and 5.

The metal stack strategy of the present invention provides a simplified metal stack option that has the following advantages: three levels of hierarchy, highest compaction and maximum performance at the module level because the module nets can be routed at the top level using minimum pitch in areas not covered by the global nets, and high performance for the global nets.

As discussed previously, current metal stack strategies also impact manufacturability of ASICS because ASICS require that a different ASIC core be designed for every metal stack option offered in a process technology node. This approach is both time-consuming and expensive because for every ASIC core designed, multiple layouts and multiple timing signoffs and timing views are needed for at worst, as many as the number of metal stack options offered.

The second aspect of the present invention solves this problem by providing a metal stack strategy that enables a single ASIC core to be used with different metal stack options. This aspect of the present invention proposes the ASIC core is the designed based on a common denominator for each of the metal stack options offered.

Referring now to FIG. 6, a flow chart is shown illustrating a process for reusing a single ASIC core design with different metal stack options in accordance with a preferred embodiment of the present invention. The process begins in step 200 by defining x common metal layers across multiple metal stack options, wherein interconnects on each of the metal layers have common physical and electrical characteristics. An ASIC core design is defined in step 202 based on the x common metal layers, thereby making the ASIC core compatible with the different metal stack options. In step 204, given custom ASIC designs, each having a total of y metal layers where y>x, respective custom ASICS are fabricated using the ASIC core design and different ones of the metal stack options.

Because the x layers in the ASIC core will have interconnects having the same physical and electrical characteristics of each of the metal stack options, only one ASIC core per metal stack family needs to be designed for one process technology generation. For example, with the present invention, only one reusable ARM core design needs to be defined for all metal stack configurations for a 130 nm process technology.

FIG. 7 depicts how an ASIC core is designed based on a common denominator of offered metal stack options. The example in FIG. 7 shows three metal stack options; 4+1+R comprising a total of six layers; 5+1+R comprising a total of seven layers, and 6+1+R comprising a total of eight layers. The numeric designations for the metal stack options describe the metal layer configurations. For example, 4+1+R describe a metal stack option having four layers of the thinnest interconnects, followed by one layer of interconnects of a different thickness, followed by a power redistribution layer (R), which is always the top layer and patterned very wide.

This example assumes that the common denominator for all three metal stack options is based on an ASIC core having four thin metal layers, M1–M4. The thin metal layers comprising the ASIC core may be designed based on analyzing the critical paths, as described in the first aspect of the present invention. Once this ASIC core is fabricated, any of the three metal stack options may be patterned on top of the ASIC core to provide custom ASIC solutions.

An improved metal stack strategy has been disclosed. The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

What is claimed is:

1. A method for defining an optimized metal stack option, the method comprising the steps of:
    (a) using interconnect data from timing critical paths from at least one previous design to generate interconnect statistical data;
    (b) using the interconnect statistical data to vary physical properties of interconnects in a current design during simulation until optimum performance is achieved; and
    (c) patterning the interconnects within the metal stack option using a combination of two thicknesses and one pitch.

2. The method of claim 1 wherein step (b) further includes the step of varying thickness, width, and pitch of the interconnects.

3. The method of claim 2 wherein step (b) further includes the step of analyzing performance of interconnects based on combinations of interconnect thickness, width, and pitch to determine which combinations yield the greatest performance.

4. The method of claim 3 wherein step (b) further includes the step of varying the physical properties of interconnects using a number of logic levels and average wire length in addition to the interconnect statistical data.

5. A method for defining an optimized metal stack option, the method comprising the steps of:
    (a) using interconnect data from timing critical paths from at least one previous design to generate interconnect statistical data;
    (b) using the interconnect statistical data to vary physical properties of interconnects in a current design during simulation until optimum performance is achieved;
    (c) defining x common metal layers across at least two metal stack options, wherein interconnects on each of the metal layers have common physical and electrical characteristics;
    (d) defining an ASIC core design based on the x common metal layers, thereby making the ASIC core compatible with the different metal stack options; and
    (e) given custom ASIC designs, each having a total of y metal layers where y>x, fabricating respective custom ASICS using the ASIC core design and different ones of the metal stack options.

6. A method for defining an optimized metal stack option, the method comprising the steps of:
    (a) providing the metal stack with multiple layers including a top layer and at least two sublayers, when the sublayers include a middle layer and a bottom layer;
    (b) patterning bottom layer interconnects with a minimum thickness;
    (c) patterning middle and top layers interconnects with a thickness double that of the bottom layer interconnects;
    (d) patterning the bottom and middle layer interconnects with a base pitch; and
    (e) allowing the interconnects on the top layer to be patterned using either the base pitch or a double pitch.

7. The method of claim 6 further including the step of basing the thickness of the interconnects on an analysis of interconnect statistical data to determine which combinations of physical properties, including interconnect thickness, width, yield the greatest performance.

8. The method of claim 7 further including the step of varying the physical properties of interconnects using a number of logic levels and average wire length in addition to the interconnect statistical data.

9. An optimized metal stack option, comprising:

multiple metal stack layers including a top layer and two sublayers, when the sublayers include a metal layer and a bottom layer;

interconnects on the bottom layer patterned with a minimum thickness;

interconnects on the middle and top layers patterned with a thickness double that of the bottom layer interconnects; and wherein the interconnects on the bottom and middle layers are patterned with a base pitch, while the top layer interconnects are patterned with either the base pitch or a double pitch.

10. A method for defining an optimized metal stack option, the method comprising the steps of:

(a) using interconnect data from timing critical paths from at least one previous design to generate interconnect statistical data;

(b) using the interconnect statistical data to vary thickness, width, and pitch of interconnects in a current design during simulation until optimum interconnect performance is achieved; and (c) patterning the interconnects within the metal stack option using a combination of two thicknesses and one pitch.

11. A method for reusing an ASIC core design with different metal stack options, the method comprising the steps of:

(a) defining x common metal layers across at least two metal stack options, wherein interconnects on each of the metal layers have common physical and electrical characteristics;

(b) defining an ASIC core design based on the x common metal layers, thereby making the ASIC core compatible with the different metal stack options; and (c) given custom ASIC designs, each having a total of y metal layers where y>x, fabricating respective custom ASICS using the ASIC core design and different ones of the metal stack options.

12. A method for reusing an ASIC core design with different metal stack options, the method comprising the steps of:

(a) defining x common metal layers across the first and second metal stack option, wherein interconnects on each of the metal layers have common physical and electrical characteristics;

(b) designing and fabricating a plurality of ASIC cores using the x common metal layers, thereby making the ASIC cores compatible with the different metal stack options;

(c) fabricating a first custom ASIC by patterning the first metal stack option on top of a first one of the ASIC cores; and (d) fabricating a second custom ASIC by patterning the second metal stack option on top of a second one of the ASIC cores, thereby using a same ASIC core design with different metal stack options.

* * * * *